United States Patent [19]
Himeno

[11] Patent Number: 5,761,125
[45] Date of Patent: Jun. 2, 1998

[54] CELL THRESHOLD VALUE DISTRIBUTION DETECTION CIRCUIT AND METHOD OF DETECTING CELL THRESHOLD VALUE

[75] Inventor: Toshihiko Himeno, Kawasaki, Japan

[73] Assignee: Kabushiki Kaisha Toshiba, Kawasaki, Japan

[21] Appl. No.: 512,914

[22] Filed: Aug. 9, 1995

[30] Foreign Application Priority Data

Aug. 10, 1994 [JP] Japan ............................ 6-188558

[51] Int. Cl.⁶ ........................................ G11C 11/34
[52] U.S. Cl. ........................ 365/185.24; 365/185.21
[58] Field of Search ................... 365/185.21, 185.01, 365/185.24

[56] References Cited

U.S. PATENT DOCUMENTS

| | | | |
|---|---|---|---|
| 5,241,505 | 8/1993 | Hashimoto | 365/185.21 |
| 5,243,573 | 9/1993 | Makihara et al. | 365/185.21 |
| 5,253,201 | 10/1993 | Atsumi et al. | 365/185.21 |
| 5,262,984 | 11/1993 | Noguchi et al. | 365/185.21 |
| 5,268,870 | 12/1993 | Harari | 365/185.21 |
| 5,293,345 | 3/1994 | Iwahashi | 365/185.21 |
| 5,299,162 | 3/1994 | Kim et al. | 365/185.21 |
| 5,301,149 | 4/1994 | Jinbo | 365/185.21 |
| 5,321,655 | 6/1994 | Iwahashi et al. | 365/185.21 |
| 5,331,597 | 7/1994 | Tanaka | 365/185.21 |
| 5,336,936 | 8/1994 | Allen et al. | 365/185.21 |
| 5,548,146 | 8/1996 | Kuroda et al. | 365/185.01 |

*Primary Examiner*—A. Zarabian
*Attorney, Agent, or Firm*—Banner & Witcoff, Ltd.

[57] ABSTRACT

The features of the present invention are that the distribution of the threshold voltages of cell transistors in one row of a non-volatile memory cell array can be measured by the I–V characteristic measurement for one time. In the cell threshold distribution detection circuit, a plurality of voltage comparison circuits are provided respectively for the bit lines, each for comparing a voltage of a corresponding bit line with a reference voltage VREF. Each of the comparison circuits has a first current node for allowing a first current I1 to flow in the case where the bit line voltage is higher than the reference voltage, and a second current node for allowing a second current I2 to flow in the case where the bit line voltage is lower than the reference voltage. The first current nodes of the comparison circuits are commonly connected to an external pad and the second current nodes of the comparison circuits are commonly connected to an external pad.

28 Claims, 8 Drawing Sheets

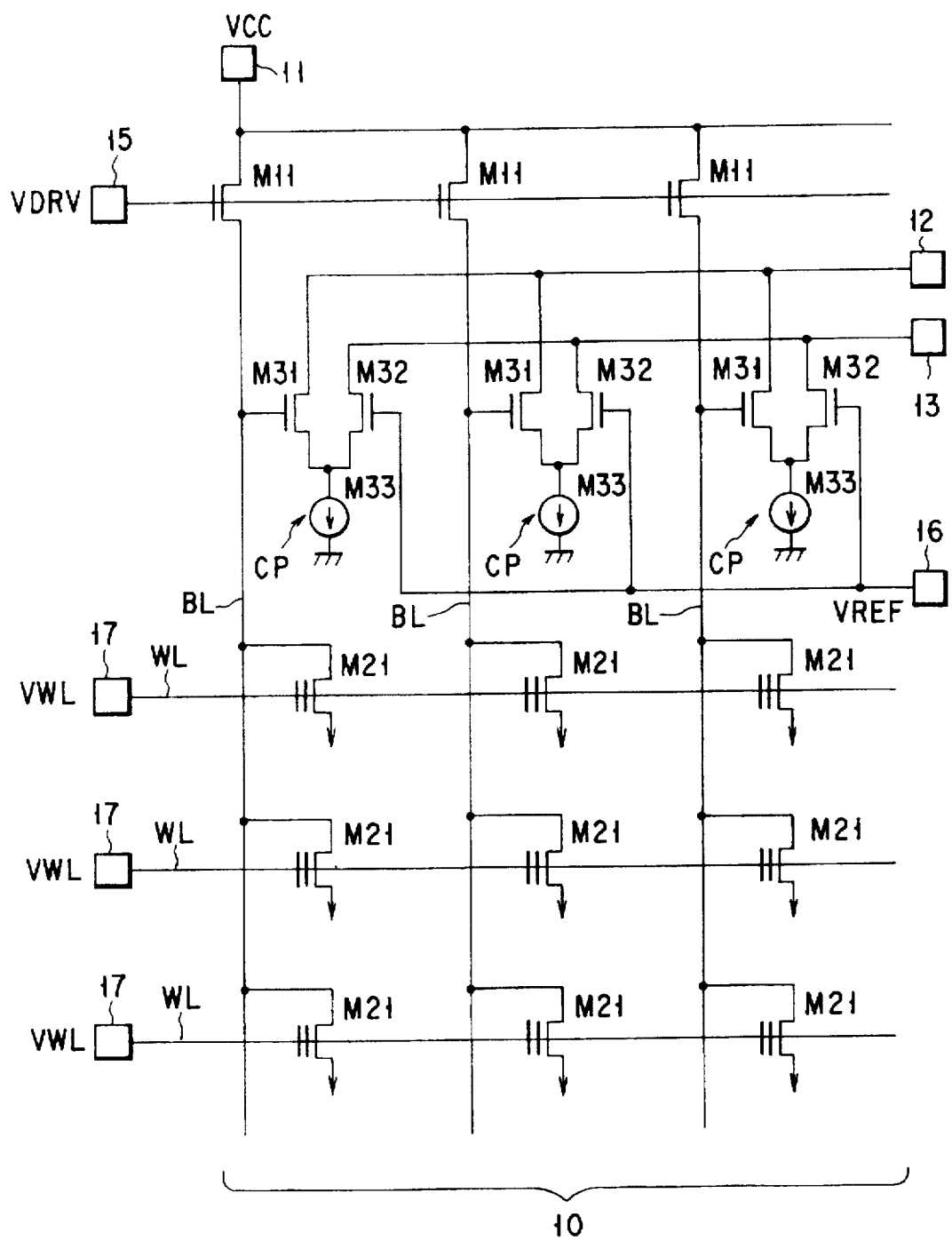
F I G. 1

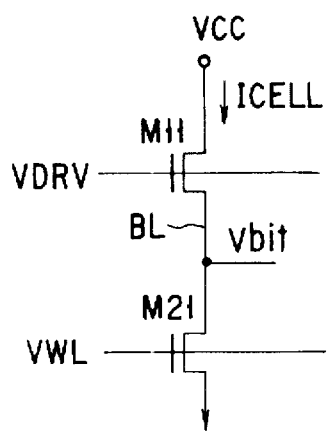
F I G. 2A
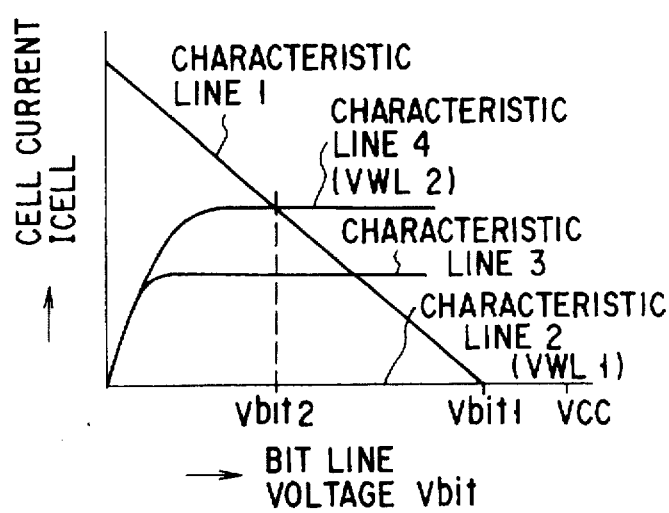
F I G. 2B
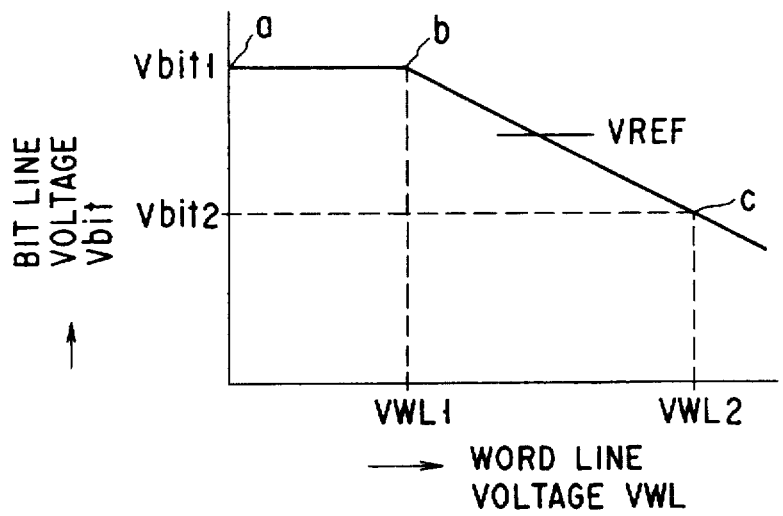
F I G. 3
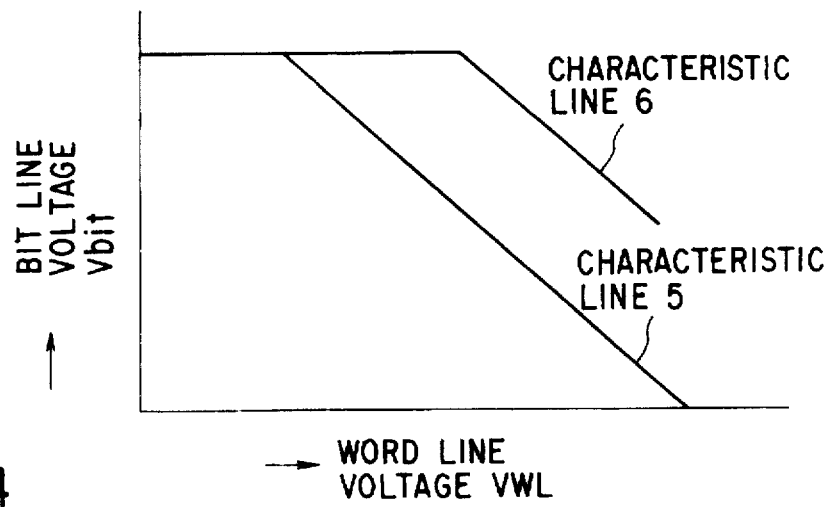
F I G. 4

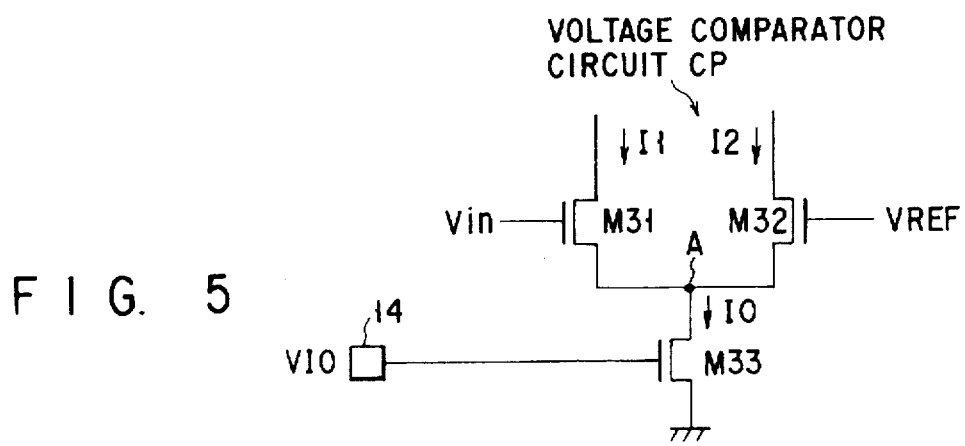
F I G. 5
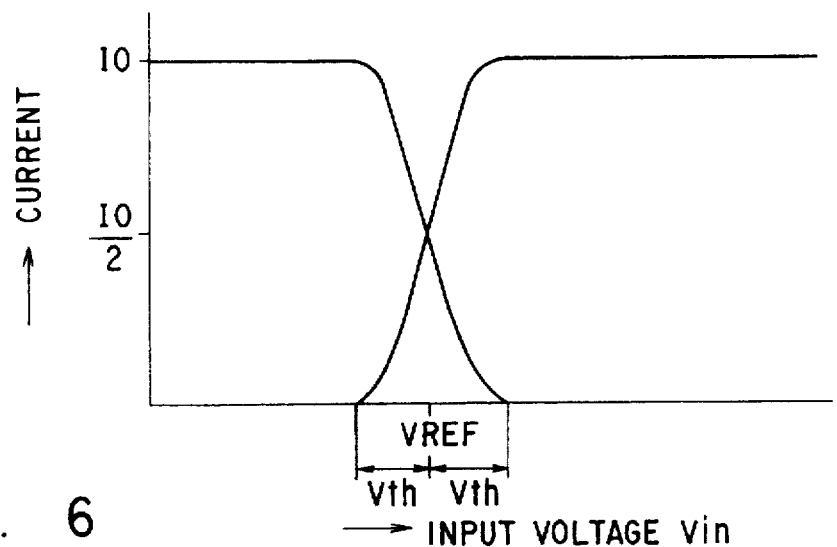
F I G. 6
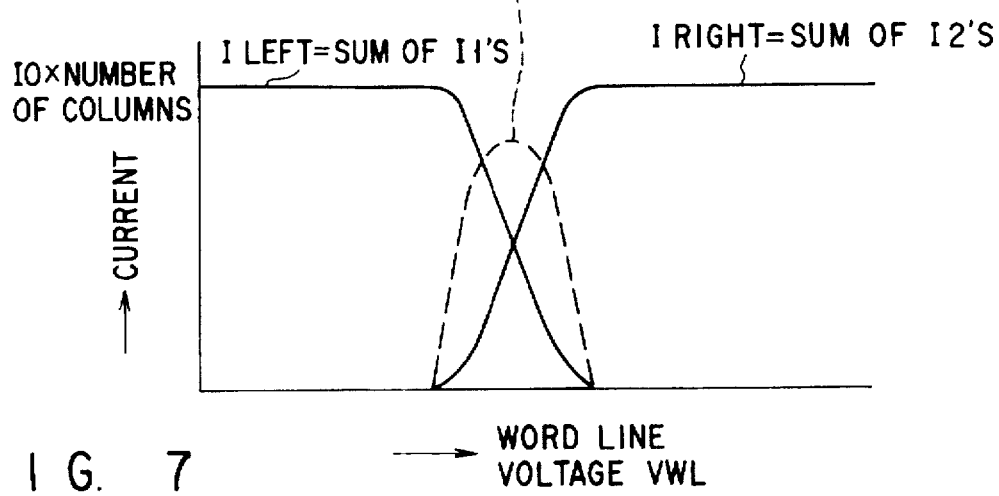
F I G. 7

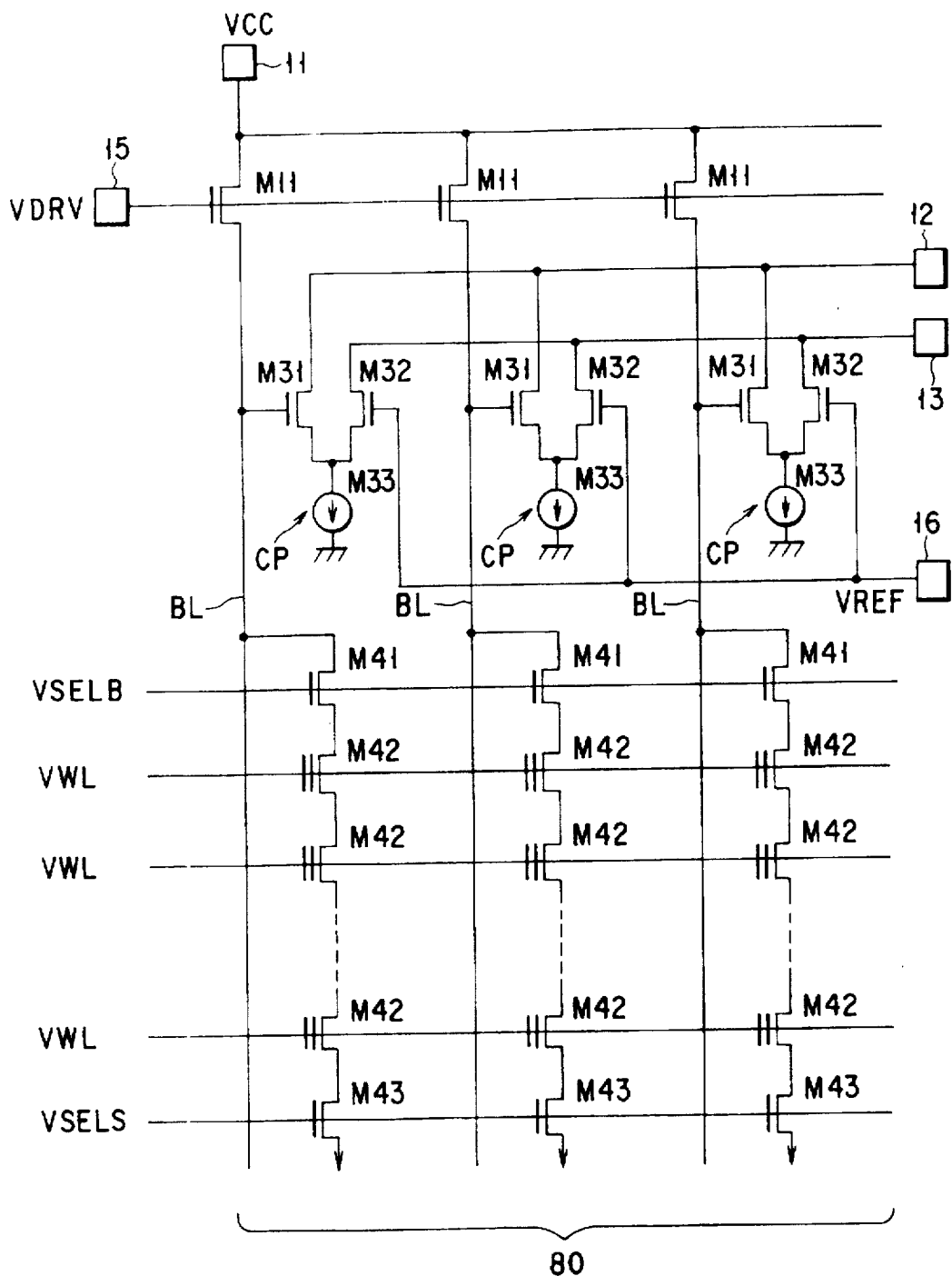
F I G. 8

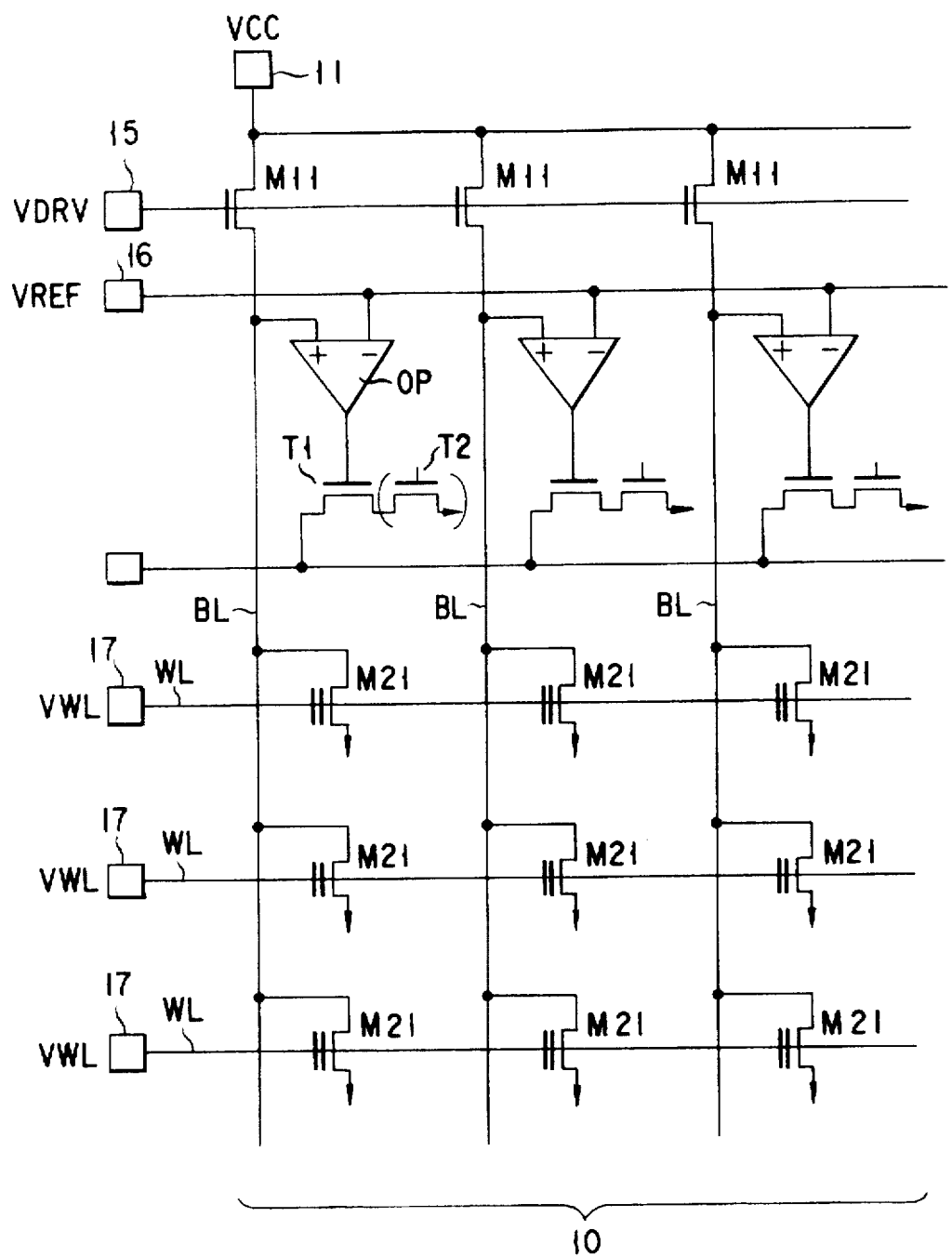
F I G. 9

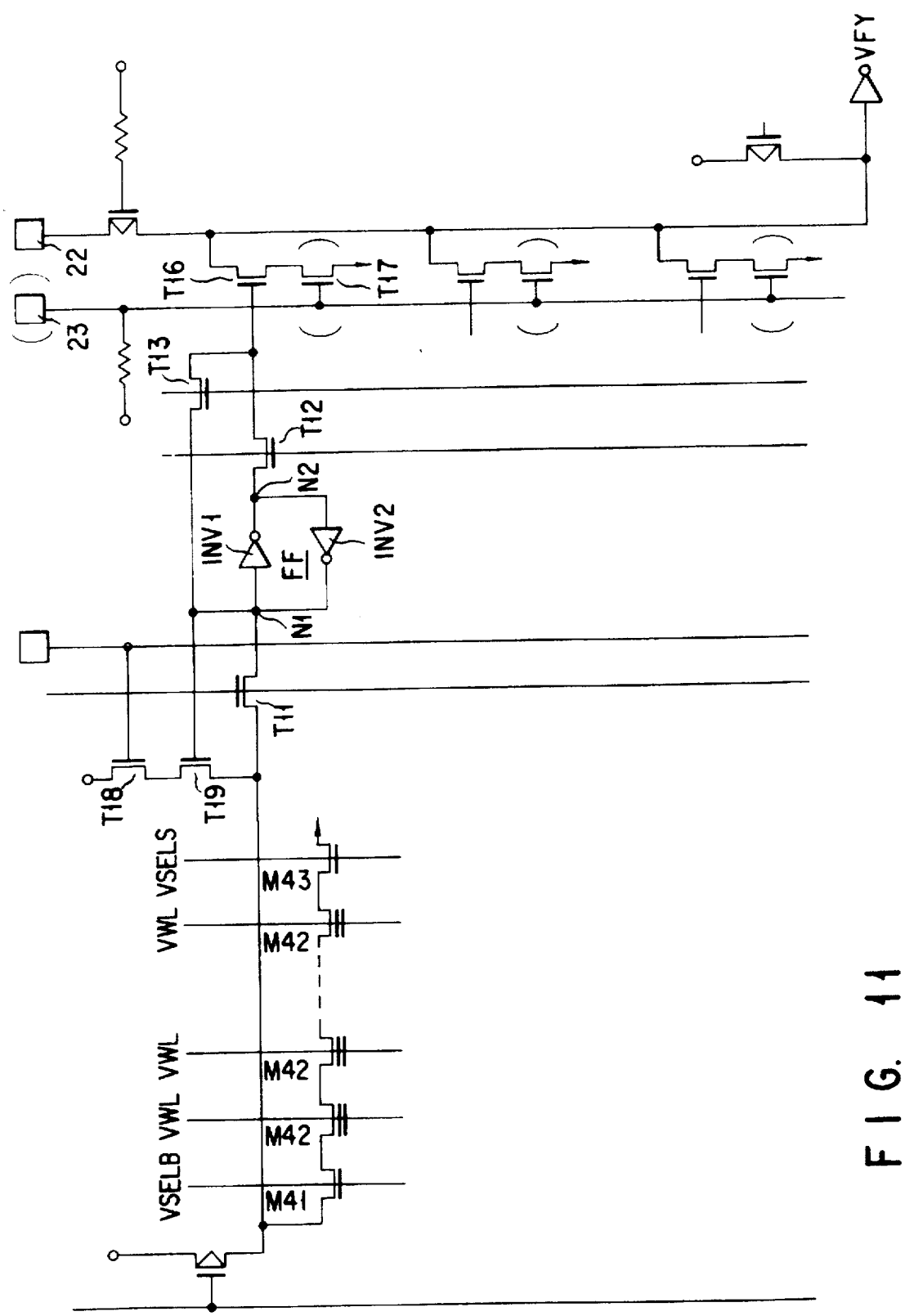
F I G. 11

CELL THRESHOLD VALUE DISTRIBUTION DETECTION CIRCUIT AND METHOD OF DETECTING CELL THRESHOLD VALUE

BACKGROUND OF THE INVENTION

1. Field of the Invention

The present invention relates to a non-volatile semiconductor memory device, and more specifically, to a detection circuit for detecting a distribution of threshold voltages of a plurality of non-volatile memory cells connected to the same word line of a memory cell array, and a detection method thereof.

2. Description of the Related Art

In an EEPROM having an electrically-programmable or erasable non-volatile memory cell array or an EPROM having a UV-erasable and electrically programmable non-volatile memory cell array, a cell transistor having a gate structure in which a floating gate and a control gate are laminated via an insulation film, is used and the threshold voltage of the cell transistor is determined in accordance with "1" or "0" of memory data.

The cell transistor having the above-described laminated gate structure has the following characteristics. That is, when charges are stored in the floating gate, the threshold value is raised and the cell current flowing in the cell transistor is decreased; whereas when the charges in the floating gate are extracted, the threshold value is lowered, thus increasing the cell current.

A circuit for reading data stored in the above-described cell transistor is constituted of a load circuit for converting a cell current into a voltage and a sense amplifier circuit for sensing and amplifying the converted voltage. The reading circuit, for reading the data of the thresholds of a plurality of cells, converts them into digital data in such a manner that data "0" is assigned to the memory data of a cell in which the threshold exceeds a predetermined reference voltage, whereas data "1" is assigned to the memory data of a cell in which the threshold is lower than the predetermined reference voltage.

In the development of a non-volatile memory device, various characteristics of the cell transistor are measured in order to evaluate the reliability thereof. Measurements and evaluations are conducted in terms of a great number of items, that is, not only the measurement of the static characteristics of the cell transistor, but also the evaluation of the programming and erasing characteristics, the data maintenance characteristics and the threshold distribution. The measurements and evaluations are carried out on cell transistors formed under various process conditions, in order to determine the optimal condition or analyze the cause of defects.

These evaluations are carried out also on the respective memory cells. However, it is expected that memory cells arranged in a matrix array are influenced by different factors in many respects from those of the influence on a single memory cell. Further, it is necessary to measure the distribution of the characteristics regarding a great number of cells, and therefore it is very important to measure the characteristics of memory cells arranged in a matrix array.

It is preferable that the threshold values of the transistors of the cell array should be distributed in a range as narrow as possible, and it is necessary that the threshold values should be distributed with a margin from the reading judgment reference voltage.

The threshold distribution of a cell transistor is generally expanded as a write/read is repeated, and due to this phenomenon, the margin from the judgment reference voltage is narrowed, and accordingly, the margin in a read is narrowed. As a result, the reading speed is lowered in some cases, even causing an erroneous operation in a worse case.

For the reason stated above, a non-volatile memory is examined as to whether or not a desired margin is obtained with respect to the maximum value of the threshold distribution, or the minimum value of the judgment reference voltage after a write/erase. If the desired margin is not maintained, a write/erase operation is repeated until the margin is realized.

For example, in an NOR-type EEPROM, the reading operation is carried out while setting a word line voltage lower than the externally supplied power potential $V_{CC}$ of the memory by a predetermined value corresponding to a margin, in order to establish a desired margin to the maximum value of the threshold distribution of the cell transistor with respect to the judgment reference voltage in an erase operation. In this operation, when all the cells are "1", the maximum value of the threshold distribution has a margin with respect to the judgment reference value. In order to realize the margin with respect to the reading judgment reference voltage, the erase/read is repeated until all the cells become "1", while varying the word line voltage. Similarly, a margin with respect to the minimum value of the threshold distribution in a write operation is realized, thus improving the reliability.

There is a conventional method of evaluating the reliability of a non-volatile memory cell, wherein write and erase are repeated a number of times, and the variation of the threshold distribution at that time is measured. With this measurement, the deterioration of the gate oxide film, of the cell can be evaluated. It is known that the deterioration of the gate oxide film of the cell, which is caused due to the repetitious read/write operations, makes an input/output of charges with respect to the floating gate easily occur. Therefore, the write/erase is carried out at a high speed, and the distribution of the write/erase characteristics of the cell is widened. As a result, a threshold distribution is widened.

It is required that a processing technique should have a step of reducing the above-described deterioration of the gate oxide film of a cell, and therefore such a processing technique has means for easily carrying out a test of evaluating the reliability of a cell. A most simple example of the means for measuring the thresholds of cells, is a reading method carried out while varying the voltages of word lines.

More specifically, a word line voltage of a selected cell is controlled from outside, and a reading operation is carried out while varying it from a low voltage to a high voltage. The word line voltage at which the data "0" is converted to data "1", is the threshold value of the selected cell. When such an operation is carried out repeatedly for all the cells, the thresholds of all the cells can be obtained.

In a general reading operation for a cell, the externally supplied power potential $V_{CC}$ is supplied to the word line of a selected cell, and the selected cell current and the reference cell current flowing in the reference cell are compared with each other. When the selection cell current is larger, the data is judged to be "1", whereas the reference cell current is larger, the data is judged to be "0".

The word line voltage of a selected cell is set at the externally supplied power potential $V_{CC}$, and the reading operation is carried out while controlling the gate voltage of the reference cell. When such an operation is carried out repeatedly for all the cells, the thresholds of all the cells can be obtained.

However, the above-described detection method in which the operation for reading data of 1 bit is repeated for all cells while externally controlling the word line potential of a selected cell, or the gate voltage of a reference cell, needs to carry out the reading operation for the same number of times as the number of all the bits, thus requiring a long period of time for measuring the threshold distribution of the cells.

Further, in order to carry out the reading operation bit by bit, it is necessary to select the addresses of memory cells successively at a high speed. For conducting such a selection, an expensive measurement device capable of carrying out a measurement in an AC manner, is required, thus increasing the cost for conducting the evaluation.

When the memory capacity of a memory cell array is increased, the threshold distribution of the cell transistor is accordingly widened, and therefore it becomes particularly important to measure the threshold distribution characteristics for evaluating the reliability. However, the problem of requiring a long time for the measurement, becomes more significant as the memory capacity is increased.

As described above, in the case where the threshold distribution of cell transistors of the memory cell array of a non-volatile memory is measured, conventionally, the reading operation for a single bit is repeated, thus requiring a long time for the threshold distribution measurement.

SUMMARY OF THE INVENTION

The present invention has been proposed in order to solve the above-described problems, and the object thereof is to provide a cell threshold distribution detection circuit and a cell threshold distribution detection method, capable of easily measuring the threshold distribution of cell transistors of one row in the memory cell array of a non-volatile memory in an I-V characteristics measurement by one time.

According to an aspect of the present invention, there is provided a cell threshold distribution detection circuit comprising: a memory cell array, formed on a semiconductor substrate, in which cell transistors constituting non-volatile memory cells are arranged in a matrix array; a plurality of word lines each connected to cell transistors of a corresponding row of the memory cell array and applied with a word line voltage for selecting the row; a plurality of bit lines for transferring data from/to cell transistors of the memory cell array; a plurality of bit line loads connected between the bit lines of the memory cell array and a first external voltage supply terminal; and a plurality of voltage comparison circuits provided respectively for the bit lines, each for comparing a voltage of a corresponding bit line with a reference voltage, each of the comparison circuits having a first current node for allowing a first current to flow in the case where the bit line voltage is higher than the reference voltage, and a second current node for allowing a second current to flow in the case where the bit line voltage is lower than the reference voltage, and the first current nodes of the voltage comparison circuits being connected to a second external voltage supply terminal and the second current nodes of the voltage comparison circuits being connected to a third external voltage supply terminal.

According to another aspect of the present invention, there is provided a cell threshold distribution detection method applied to a cell threshold distribution detection circuit comprising: a memory cell array, formed on a semiconductor substrate, in which cell transistors constituting non-volatile memory cells are arranged in a matrix array; a plurality of word lines each connected to cell transistors of a corresponding row of the memory cell array; a plurality of bit lines for transferring data from/to cell transistors of the memory cell array; a plurality of bit line loads connected between the bit lines of the memory cell array and a first external voltage supply terminal; and a plurality of voltage comparison circuits provided respectively for the bit lines, each for comparing a voltage of a corresponding bit line with a reference voltage, each of the comparison circuits having a first current node for allowing a first current to flow in the case where the bit line voltage is higher than the reference voltage, and a second current node for allowing a second current to flow in the case where the bit line voltage is lower than the reference voltage, and the first current nodes of the voltage comparison circuit being connected to a second external voltage supply terminal and the second current nodes of the voltage comparison circuits being connected to a third external voltage supply terminal, the method comprising the steps of: setting a voltage for word lines of non-selected rows in the memory cell array so that all the memory cells connected to the word lines of the non-selected rows are turned off; increasing a voltage of a word line of a selected row in the memory cell array from a voltage by which all the memory cells connected to the word line of the selected row are turned off to a voltage by which all the memory cells connected to the word line of the selected row are turned on; and detecting a cell threshold distribution of the memory cells connected to the word line of the selected row by differentiating at least one of a current flowing in the second external voltage supply terminal and a current flowing in the third external voltage supply terminal, which change in accordance with a change in voltage of the word line of the selected row.

According to still another aspect of the present invention, there is provided a cell threshold distribution detection method applied to a cell threshold distribution detection circuit comprising: a memory cell array, formed on a semiconductor substrate, in which NAND strings each made of a plurality of series-connoted cell transistors constituting non-volatile memory cells and a selection-gate transistor connected to the cell transistor in series are arranged in a matrix array; a plurality of word lines each connected to cell transistors of a corresponding row of the memory cell array; a plurality of bit lines for transferring data from/to cell transistors of the memory cell array; a plurality of bit line loads connected between the bit lines of the memory cell array and a first external voltage supply terminal; and a plurality of voltage comparison circuits provided respectively for the bit lines, each for comparing a voltage of a corresponding bit line with a reference voltage, each of the comparison circuits having a first current node for allowing a first current to flow in the case where the bit line voltage is higher than the reference voltage, and a second current node for allowing a second current to flow in the case where the bit line voltage is lower than the reference voltage, and the first current nodes of the voltage comparison circuits being connected to a second external voltage supply terminal and the second current nodes of the voltage comparison circuits being connected to a third external voltage supply terminal, the method comprising the steps of: turning off non-selected NAND strings in the memory cell array; setting a voltage for word lines of non-selected rows in selected NAND stings so that all the memory cells connected to the word lines of the non-selected rows in the selected NAND strings, are turned off; increasing a voltage of a word line of a selected row in the selected NAND strings from a voltage by which all the memory cells connected to the word line of the selected row are turned off to a voltage by which all the memory cells connected to the word line of the selected row are turned on; and detecting a cell threshold distribution of the memory cells connected to the word line of the selected row in the selected NAND strings by differentiating at least one of a current flowing in the second external voltage supply terminal and a current flowing in the third external voltage supply terminal, which change in accordance with a change in voltage of the word line of the selected row.

In the cell threshold distribution detection circuit of the present invention, a voltage comparing circuit provided for each bit line, includes the first current node for allowing the first current to flow when the bit line voltage is higher than the reference voltage in the comparison between the bit line voltage and the reference voltage, and the second current node for allowing the second current to flow when the bit line voltage is lower than the reference voltage in the comparison. The first current nodes of the voltage comparing circuits are each connected to a second external voltage supply terminal, and the second current nodes are each connected to a third external voltage supply terminal.

With use of the cell threshold distribution detection method of the present invention, the voltages of word lines of non-selected rows of the memory cell array are set so that all the memory cells connected to the word lines of the non-selected row are turned off. While maintaining this state, the voltage of a word line of the selected row of the memory cell array is gradually increased from a voltage with which all the memory cells connected to the word line of the selected row are turned off, to a voltage with which all the memory cells connected to the word line of the selected row are turned on. Thus, the bit line potential is reduced in the order from a bit line connected to a cell having a low threshold to a bit line connected to a cell connected to a high threshold. Accordingly, in the same order, the current output modes of the voltage comparing circuits connected to the bit lines are inverted. That is, the current flowing to the second external voltage supply terminal is gradually reduced, while the current flowing to the third external voltage supply terminal is gradually increased. Therefore, if it is supposed that the threshold values of cell transistors of one row are distributed in a Gauss distribution, it is possible to detect the distribution of threshold voltages of a plurality of non-volatile memory cells connected to the word line of the selected row, by differentiating at least one of the current flowing to the second external voltage supply terminal and the current flowing to the third external voltage supply terminal, varying in accordance with a change in voltage of the word line of the selected row.

As described above, the threshold distribution of the cell transistors of one row can be measured by the I–V characteristic measurement for one time, and therefore, the measurement can be conducted very simply as compared to the conventional method in which the reading operation is repeated a great number of times. Such a characteristic is very effective for the problem of an increase in time of evaluation and test, which rises as the memory capacity increases, and therefore the cost for the evaluation can be reduced and the testing time can be shortened.

In the measurement using the cell threshold distribution detection circuit of the present invention, it suffices only if an address of a memory cell array is selected successively in the unit of one row, and the threshold distribution can be measured by using an inexpensive DC measurement device without using an expensive measurement device such as an AC tester, thus making it possible to reduce the evaluation cost. Further, the threshold distribution can be output as a waveform, and therefore it is not necessary to provide a great number of memory devices, thus making it possible to decrease the evaluation cost, accordingly.

According to the present invention, there is further provided a cell threshold distribution detection circuit comprising: a memory cell array, formed on a semiconductor substrate, in which a plurality of cell transistors constituting a plurality of non-volatile memory cells are arranged in a matrix array; a plurality of word lines each connected to those of the cell transistors which are in a corresponding row in the memory cell array; a plurality of bit lines for transferring data from/to the cell transistors of the memory cell array; a plurality of voltage comparison circuits provided respectively for the bit lines, each of the comparison circuits having a first current node and a second current node, for comparing a voltage of each bit line and a reference voltage to allow the first current to flow through a first current node in the case where the voltage of the bit line is higher than the reference voltage and a second current to flow through a second current node in the case where the voltage of the bit line is lower than the reference voltage; a first external terminal connected to the first current nodes of the voltage comparator circuits; a second external terminal connected to the second current bodes of the voltage comparator circuits; and a plurality of third external terminals respectively connected to the word lines.

According to the present invention, there is still further provided a cell threshold distribution detection method applied to a cell threshold distribution detection circuit, the detection circuit comprising: a memory cell array, formed on a semiconductor substrate, in which a plurality of cell transistors constituting a plurality of non-volatile memory cells are arranged in a matrix array; a plurality of word lines each connected to those of the cell transistors which are in a corresponding row in the memory cell array; a plurality of bit lines for transferring data from/to the cell transistors of the memory cell array; and a plurality of voltage comparison circuits provided respectively for the bit lines, each of the comparison circuits having a first current node and a second current node, for comparing a voltage of each bit line and a reference voltage to allow the first current to flow through a first current node in the case where the voltage of the bit line is higher than the reference voltage and a second current to flow through a second current node in the case where the voltage of the bit line is lower than the reference voltage; a first external terminal connected to the first current nodes of the voltage comparator circuits; a second external terminal connected to the second current bodes of the voltage comparator circuits; and a plurality of third external terminals respectively connected to the word lines, in which the method comprises the steps of: applying a voltage to a word line from a third external terminal to select a word line; changing the voltage applied to the selected word line from a voltage value at which those of the cell transistors connected to the selected word line are turned off to a voltage value at which the cell transistors connected to the selected word line are turned off; connecting the first currents flowing through the first external terminal and the second currents flowing through the second external terminal; and differentiating at least one of a current flowing through the first external terminal and a current flowing through the second external terminal to determine a cell threshold distribution of the cell transistors connected to the selected word line.

According to the present invention, there is yet further provided a cell threshold distribution detection circuit comprising: a memory cell array, formed on a semiconductor substrate, in which a plurality of cell transistors constituting a plurality of non-volatile memory cells are arranged in a matrix array; a plurality of word lines each connected to those of the cell transistors which are in a corresponding row in the memory cell array; a plurality of bit lines for transferring data from/to the cell transistors of the memory cell array; a plurality of operational amplifiers provided respectively to the bit lines, each of the operational amplifiers for comparing a voltage of each bit line and a reference voltage to output an output voltage having a first level in the case where the voltage of the bit line is higher than the reference voltage and a second level in the case where the voltage of the bit line is lower than the reference voltage; a first external terminal; a plurality of NMOS transistors respectively provided to the operational amplifiers, each having a gate for receiving an output voltage of an operational amplifier and a drain connected to the first external terminal, each of the NMOS transistors being turned on when the output voltage of a corresponding operational amplifier has the first level to allow a current through the first external terminal to flow; and a plurality of second external terminals respectively connected to the word lines.

According to the present invention, there is further provided a cell threshold distribution detection circuit comprising: a memory cell array, formed on a semiconductor substrate, in which a plurality of cell transistors constituting a plurality of non-volatile memory cells are arranged in a matrix array; a plurality of word lines each connected to those of the cell transistors which are in a corresponding row in the memory cell array; a plurality of bit lines for transferring data from/to the cell transistors of the memory cell array; a plurality of operational amplifiers provided respectively to the bit lines, each of the operational amplifiers for comparing a voltage of each bit line and a reference voltage to output an output voltage having a first level in the case where the voltage of the bit line is higher than the reference voltage and a second level in the case where the voltage of the bit line is lower than the reference voltage; a first external terminal; a plurality of NMOS transistors respectively provided to the operational amplifiers, each having a gate for receiving an output voltage of an operational amplifier and a drain connected to the first external terminal and a source connected to ground, each of the NMOS transistors being turned on when the output voltage of a corresponding operational amplifier has the first level to allow a current through the first external terminal to flow; and a plurality of second external terminals respectively connected to the word lines.

According to the present invention, there is still further provided a cell threshold distribution detection circuit comprising: a memory cell array, formed on a semiconductor substrate, in which a plurality of NAND strings each including a plurality of series-connected cell transistors constituting non-volatile memory cells and a selection-gate transistor connected to the cell transistors in series are arranged in a matrix array; a plurality of word lines each connected to those of the cell transistors which are in a corresponding row in the memory cell array; a plurality of bit lines for transferring data from/to the cell transistors of the memory cell array; a plurality of flip-flop circuits provided respectively to the bit lines, each of the flip-flop circuits having a first data node and a second data node for latching complementary logic level data, the first data node being connected to a side of the memory cell array; a first external terminal; a plurality of NMOS transistors respectively provided to the flip-flop circuits, each having a gate connected to the second input node of a flip-flop circuit and a drain connected to the first external terminal and a source connected to ground, each of the NMOS transistors being turned on when a logic level data of the second input node of a corresponding flip-flop circuit changes from a first logic level to a second logic level to allow a current through the first external terminal to flow; and a plurality of second external terminals respectively connected to the word lines.

According to the present invention, there is yet further provided a cell threshold distribution detection method applied to a cell threshold distribution detection circuit, the detection circuit comprising: a memory cell array, formed on a semiconductor substrate, in which a plurality of NAND strings each including a plurality of series-connected cell transistors constituting non-volatile memory cells and a selection-gate transistor connected to the cell transistors in series are arranged in a matrix array; a plurality of word lines each connected to those of the cell transistors which are in a corresponding row in the memory cell array; a plurality of bit lines for transferring data from/to the cell transistors of the memory cell array; a plurality of flip-flop circuits provided respectively to the bit lines, each of the flip-flop circuits having a first data node and a second data node for latching complementary logic level data, the first data node being connected a side of the memory cell array; a first external terminal; a plurality of NMOS transistors respectively provided to the flip-flop circuits, each having a gate connected to the second input node of a flip-flop circuit and a drain connected to the first external terminal and a source connected to ground, each of the NMOS transistors being turned on when a logic level data of the second input node of a corresponding flip-flop circuit changes from a first logic level to a second logic level to allow a current through the first external terminal to flow; a plurality of second external terminals respectively connected to the word lines; in which the method comprises the steps of: applying a voltage to a word line from a second external terminal to select a word line; changing the voltage applied to the selected word line from a voltage value at which those of the cell transistors connected to the selected word line are turned off to a voltage value at which the cell transistors connected to the selected word line are turned off; and differentiating a current flowing through the first external terminal to determine a cell threshold distribution of the cell transistors connected to the selected word line.

According to the present invention, there is more further provided a cell threshold distribution detection circuit comprising: a memory cell array, formed on a semiconductor substrate, in which a plurality of cell transistors constituting a plurality of non-volatile memory cells are arranged in a matrix array; a plurality of voltage comparison circuits provided respectively for the bit lines, each of the comparison circuits comprising a plurality of rows extending in a first direction formed in the semiconductor substrate, each of the rows including first to six impurity regions of a conductivity type, a first conductive pattern extending in a second direction perpendicular to the first direction, a second conductive pattern extending in the second direction, and a plurality of third conductive patterns extending in the second direction, the first conductive pattern including a conductive layer extending over the rows and between first and second impurity regions, the second conductive pattern including first and second conductive layers connected at one ends thereof by a conductive layer extending in the first direction, extending over the rows and between the second impurity region and the third impurity region and between the third impurity region and the fourth impurity region, respectively, each of the third pattern including fourth and sixth conductive layers connected at one ends thereof by a conductive layer extending in the first direction, extending over a row and between fourth impurity region and the fifth impurity region and between the fifth impurity region and the sixth impurity region, respectively, a first wiring layer for connecting the second impurity region, the fourth impurity region, and the sixth impurity region in a row, a second wiring layer for connecting the first impurity regions to a reference potential external terminal, a third wiring layer for connecting the third impurity regions to a first external terminal, a fourth wiring layer for connecting fifth impurity regions to a second external terminal, a fifth wiring layer for connecting the second conductive pattern to a third external terminal supplied with a reference potential, a plurality of bit lines extending in the first direction, each connected to the third conductive pattern; and a plurality of word lines extending in the second direction, each connected to those of the cell transistors which are in a corresponding row in the memory cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing a first embodiment in which the cell threshold distribution detection circuit of the present invention is applied to a NOR-type EEPROM;

FIG. 2A is a circuit diagram related to one bit line and its bit line load in the memory cell array shown in FIG. 1, and FIG. 2B is a characteristic diagram illustrating a change in voltage of a particular bit line;

FIG. 3 is a characteristic diagram showing the characteristics of the word line voltage versus bit line voltage, shown in the characteristic diagram of FIG. 2B;

FIG. 4 is a characteristic diagram illustrating how the bit line potential is influenced by the cell transistor in the characteristic diagram of FIG. 3;

FIG. 5 is a circuit diagram illustrating one unit of the voltage comparison circuits shown in FIG. 1;

FIG. 6 is a characteristic diagram illustrating the operation of a voltage comparison circuit in the NOR-type EEPROM shown in FIG. 1;

FIG. 7 is a characteristic diagram illustrating a threshold distribution detection method used in the case where it is supposed that the thresholds of cell transistors for each row in the NOR-type EEPROM shown in FIG. 1 are distributed in the manner of the Gauss' distribution;

FIG. 8 is a circuit diagram showing a second embodiment in which the cell threshold distribution detection circuit of the present invention is applied to the NAND-type EEPROM;

FIG. 9 shows a cell threshold distribution detection circuit according to a third embodiment of the present invention;

FIG. 11 shows a cell threshold distribution detection circuit according to a fifth embodiment of the present invention.

DETAILED DESCRIPTION OF THE PREFERRED EMBODIMENTS

Figure 10:
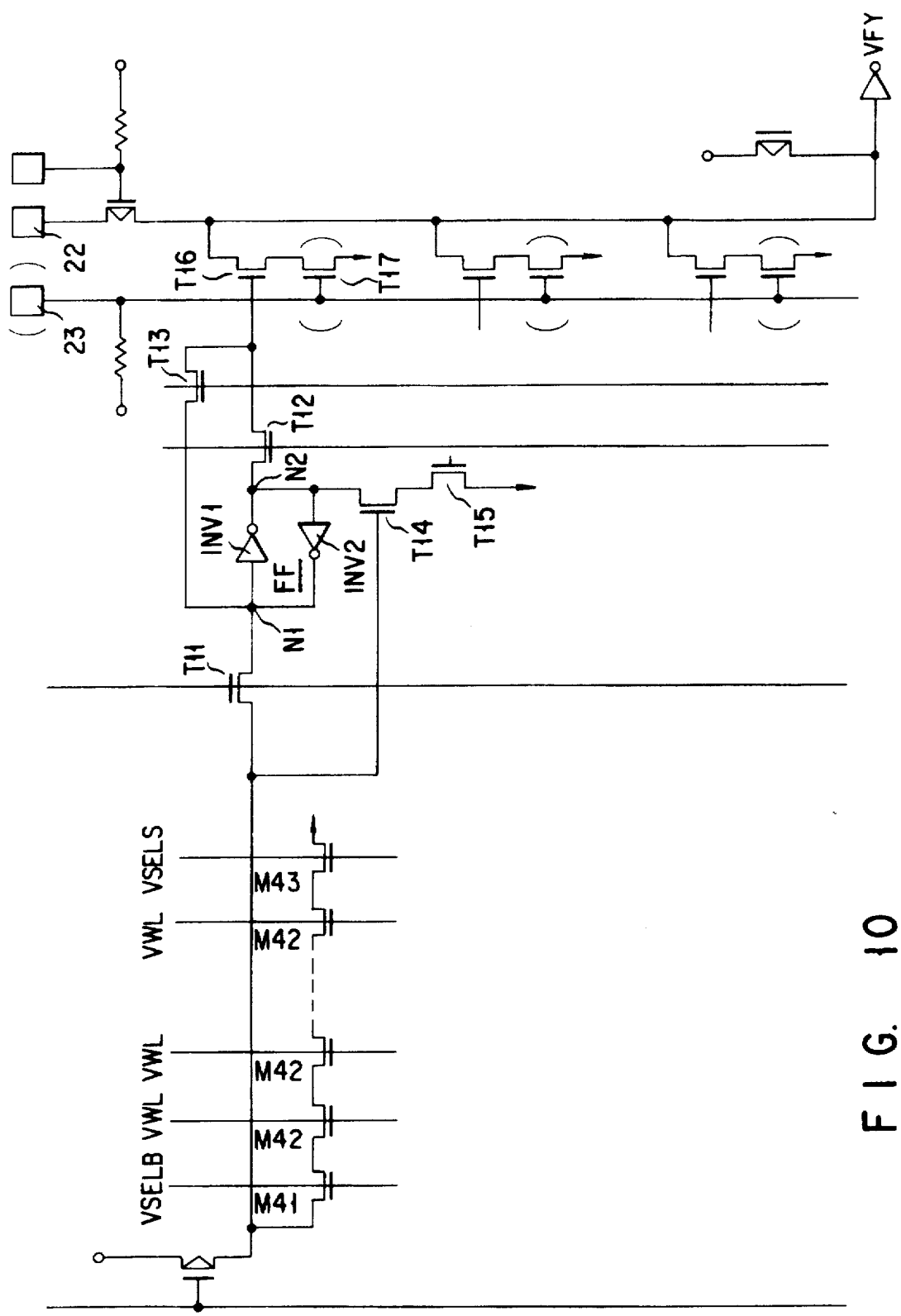
FIG. 10 shows a cell threshold distribution detection circuit according to fourth embodiment of the present invention.

Embodiments of the present invention will now be described with reference to accompanying drawings.

FIG. 1 shows a first embodiment in which the present invention is applied to an NOR-type EEPROM.

FIG. 1 illustrates a memory cell array 10 having cell transistors M21, which constitute NOR-type EEPROM memory cells, arranged in matrix, a plurality of word lines WL each connected to cell transistors M21 of a corresponding row of the memory cell array 10, and a plurality of bit lines BL for transferring data to the cell transistors M21 of the memory cell array 10 or from the cell transistors (as a typical example, three word lines and three bit lines are shown in the figure).

Further, as shown in the figure, a plurality of loads M11 for the bit lines are connected between the bit lines BL and a first pad 11, which is the first external voltage supply terminal. In this embodiment, these loads are NMOS transistors.

Further, a plurality of voltage comparison circuits CP are provided so as to correspond to the bit lines BL, each voltage comparison circuit comparing a voltage Vbit of a corresponding bit line BL with a reference voltage VREF, and allowing a current corresponding to a comparison result to flow.

Each of the voltage comparison circuits CP includes the first current node for allowing the first current to flow when the bit line voltage Vbit is higher than the reference voltage VREF, and the second current node for allowing the second current to flow when the bit line voltage Vbit is lower than the reference voltage VREF. The first current nodes of all of the voltage comparison circuits are connected to a second pad 12 which is the second external voltage supply terminal, and the second current nodes of all of the voltage comparison circuits are connected to a third pad 13, which is the third external voltage supply terminal.

Each of the voltage comparison circuits CP is constituted of a first NMOS transistor M31, a drain of which is connected to the second pad 12 and a gate of which is connected to the bit line; a second NMOS transistor M32, a drain of which is connected to the third pad 13, a gate of which is connected to the reference voltage VREF, which can be externally controlled, and a source of which is connected to the source of the first NMOS transistor M31; and a constant current source M33 connected between a node of the sources of the two NMOS transistors M31 and M32 and a ground potential node. That is, in the plurality of voltage comparison circuits CP provided to correspond to the bit lines, the drains of the first NMOS transistors M31 are connected to the second pad 12, and the drains of the second NMOS transistors M32 are connected to the third pad 13.

The above-mentioned bit line loads M11 and the voltage comparison circuits CP constitute a part of a cell threshold distribution detection circuit for detecting the distribution of threshold voltages of the plurality of cell transistors M21 connected to the same word line WL of the memory cell array 10.

The cell threshold distribution detection circuit is formed in a region of the test element group (TEG) on a semiconductor substrate wafer in some cases or in a region of a memory chip in other cases.

In order to select a word line and change the word line voltage VWL of the selected word line, for the detection of threshold distribution of cell transistors of the selected word line of a memory cell array, there is provided in this embodiment a seventh pad 17, which is the seventh external voltage supply terminal, for each corresponding word line WL, and the word line WL is connected to the pad 17. With this structure, a word line is directly selected from outside, and a voltage VWL of the selected word line can be continuously controlled. However, in place of such a structure, a word line voltage controlling circuit may be formed on a wafer.

An example of the word line voltage control circuit may comprise address input terminals to which a plurality of row address signals are input, a word line selection circuit for decoding the row address signals input to the address input terminals, and a word line drive circuit for selecting a corresponding word line in accordance with the output signals of the word line selection circuit and for supplying a continuously changing word line drive voltage to the selected word line.

FIG. 2A is a diagram showing one bit line BL and its bit line load M11 in the memory cell array 10 shown in FIG. 1 and a circuit of the corresponding portion, and FIG. 2B is a characteristic diagram illustrating a change in voltage of a bit line.

In FIG. 2B, a characteristic line 1 represents the characteristic of the load transistor M11. When the bit line potential Vbit is the same as the gate voltage VDRV of the load transistor M11, a cell current does not flow. The cell current ICELL is increased as the bit line potential Vbit is decreased. The inclination of the characteristic line 1 is determined by a mutual conductance gm of the load transistor M11, and the inclination of the characteristic line 1 becomes more gentle as the channel width/channel length (W/L) of the load transistor M11 becomes smaller and the resistance becomes higher.

In FIG. 2B, the characteristic lines 2 to 4 represent the characteristics of cell currents to bit line potentials Vbit of the cell transistor M21. When the gate voltage (the word line voltage VWL) of the cell transistor M21 is lower than the threshold of the cell transistor M21, the characteristic represented by the line 2 is obtained, and thus obtained characteristic changes to those represented by the characteristic lines 3 and 4 as the gate voltage exceeds the threshold value and becomes even higher.

It is supposed here that the word line voltage obtained at the characteristic line 2 is VWL1, whereas the word line voltage at the characteristic line 4 is VWL2. When the word line voltage is changed from VWL1 to VWL2, the bit line voltage varies from Vbit1 to Vbit2. FIG. 3 shows an example of the characteristics of the word line voltage VWL against the bit line voltage Vbit.

Next, the influence of the threshold value of the cell transistor M21 on the bit line potential Vbit will now be described with reference to FIG. 4.

FIG. 4 is a characteristic diagram showing the relationship between VWL to Vbit, where the characteristic line 5 represents a case where the threshold of the cell transistor M21 is as low as, for example, 1V, or the characteristic line 6 represents a case where the threshold of the cell transistor M21 is as high as, for example, 5V.

According to the characteristic diagram shown in FIG. 4, for the same word line voltage VWL, the cell transistor having a lower threshold can provide a larger cell current ICELL than the cell transistor having a higher threshold, and the potential Vbit of the bit line BL connected to the cell transistor having a lower threshold is lower than the potential Vbit of the bit line BL connected to the cell transistor having a higher threshold.

Next, the voltage comparison circuit CP shown in FIG. 1 will now be described with reference to FIG. 5.

In the voltage comparison circuit CP, a constant current power M33 for allowing a current I0 to flow is connected to the source node of the two NMOS transistors M31 and M32. When the Kirchhoff's law is applied to the source node, the relationship between the currents I1 and I2 flowing to the NMOS transistors M31 and M32, and the current I0 flowing to the constant current source M33, can be represented by the equation, I1+I2=I0. In the case where the gate voltages Vin and VREF to the NMOS transistors M31 and M32 are the same, since the voltage comparison circuit CP has a symmetrical structure with respect to the NMOS transistors M31 and M32, the relationship I1=I2 can be established, and I1=I2=I0/2 can be obtained.

When the gate voltage Vin of the bit line input side is higher than the gate voltage VREF of the reference input side by a threshold voltage Vth of the NMOS transistors M31 and M32 or higher, the NMOS transistor M32 is turned off, and I2=0 is obtained. That is, I1=I0 is established. Reversely, when the gate voltage VREF on the reference input side is higher than the gate voltage Vin of the bit line input side by the above threshold voltage Vth or higher, I1=0 and I2=I0. Such characteristics are shown in FIG. 6.

Next, while focusing on one bit line BL in the memory cell array in FIG. 1, the operation of the related portion will be described. Here, only a selected row is considered, and 0V is applied to the other rows which are non-selected, thus turning all the cell transistors M21 connected to the non-selected columns in an OFF state.

First, the word line voltage of the selected row is set at 0V. At this time, the cell transistor M21 of the selected row is turned off, and therefore the operation point is at a in FIG. 3, and the potential Vbit of the bit line BL connected to that cell transistor M21 is Vbit1. Next, when the voltage VWL of the word line WL connected to the gate of the cell transistor M21 is gradually increased, the operation point of the cell transistor M21 makes a transition to the operation point c through the point b.

The reference voltage VREF of the voltage comparison circuit CP is provided between Vbit1 and Vbit2 in FIG. 3. At the operation point a, the potential Vbit1 is higher than VREF, and therefore I1=I0 is obtained. When the word line voltage VWL has been increased and the operation point has made the transition to the point c via the point b, VREF becomes higher than Vbit2, and therefore I1=0 and I2=I0 are obtained.

The second pad 12 is connected to the drains of the first NMOS transistors M31 of the voltage comparison circuits CP provided to all of the bit lines BL. That is, the second pad 12 is in common to all the columns. In a similar manner, the third pad 13 is connected to the drains of the second NMOS transistors M32. In other words, the third pad 13 is common to all the columns. With this structure, the current Ileft, which is the total of the currents I1 of the first NMOS transistors M31 in each column, is allowed to flow to the second pad 12, and the current Iright, which is the total of the currents I2 of the second NMOS transistors in each column, is allowed to flow to the third pad 13.

Next, the method of detecting a threshold distribution of cell transistors for each row in the NOR-type EEPROM shown in FIG. 1, will now be described with reference to FIG. 7.

First, 0V is applied to the word lines of the non-selected rows, and thus all the cell transistors M21 connected to the non-selected rows are turned to be in an OFF state. In this state, the word line voltage VWL of the selected row is set to 0V so as to set all the cell transistors M21 of the selected row in an OFF state. In this time, the bit line potentials Vbit of all the bit lines BL are rendered higher than the reference voltage VREF, and in all the voltage comparison circuits CP, I1=I0 can be obtained. Therefore, Ileft=I0×the number of columns can be established, and Iright=0 can be obtained.

Next, when the word line voltage VWL of the selected row is gradually increased from 0V, the bit line potential Vbit is decreased in the order from a bit line BL connected to a cell M21 having a low threshold value to a bit line BL connected to a cell M21 having a high threshold value, and accordingly in the same order, the current output modes of the voltage comparison circuits CP connected to the bit lines BL are inverted. More specifically, the ON or OFF state of each of the NMOS transistors M31 and M32 is inverted in each voltage comparison circuit CP, and consequently, the total value of the currents Ileft of all the bit lines, is gradually decreased, whereas the total value of the currents Iright is gradually increased. Such characteristics are shown in FIG. 7.

FIG. 7 shows the characteristics of VWL versus Ileft and Iright in the case where the thresholds of the cell transistors M21 for one row are distributed in the Gauss' distribution.

According to the characteristics, Ileft/I0 indicates the number of cells which are turned on, and Iright/I0 indicates the number of cells which are turned off. The differentiated value of Ileft or the same of Iright indicates the threshold distribution of cell transistors M21 for one row.

The current value I0 of the constant current source M33 of the voltage comparison circuit CP is related to the overall scale of the characteristics shown in FIG. 7. The constant current source M33 can be formed easily by the NMOS transistor M33 as shown in FIG. 5, and it is desirable that the gate voltage VI0 of the transistor M33 of the constant current source can be controlled directly by the fourth pad 14. Thus, it becomes possible to control the current value of the constant current source M33. Consequently, by controlling this current value, the sensitivity of the threshold distribution measurement can be adjusted, and the variation of the sensitivities of chips on a wafer or the variation of the sensitivities of production lots can be absorbed.

In a similar manner, with the structure in which the gate voltage VDRV of the load transistor M11 can be controlled directly by the fifth pad 15, by controlling this current value, the variation of the cell currents of chips on a wafer or the variation of the cell currents of production lots can be absorbed.

Further, it is preferable that the reference voltage VREF of the voltage comparison circuit CP shown in FIG. 5 can be controlled directly by the sixth pad 16.

More specifically, according to the memory cell threshold distribution detection circuit and the memory cell threshold distribution detection method of the first embodiment, while maintaining the state where the voltages of the word lines WL of the non-selected rows are set so that all the memory cells M21 connected to the word lines WL of the non-selected rows in the memory cell array 10 are turned off, the voltage of a word line WL of a selected row in the memory cell array 10, is gradually increased from a voltage with which all the memory cells M21 connected to the word line of the selected row are turned off, to a voltage with which these memory cells M21 are turned on. Accordingly, the bit line potential Vbit is decreased in the order from a bit line BL connected to a cell M21 having a lower threshold to a bit line connected to a cell M21 having a higher threshold. Accordingly, in the same order, the current output modes of the voltage comparison circuits CP connected to the bit lines BL are inverted. More specifically, the ON or OFF state of each of the NMOS transistors M31 and M32 is inverted in each voltage comparison circuit CP, and consequently, the current flowing to the second pad 12, that is, the total value of the currents Ileft of all the bit lines, is gradually decreased, whereas the current flowing to the third pad 13, that is, the total value of the currents Iright is gradually increased. In this case, supposing that the thresholds of cell transistors M21 for one row are distributed in the manner of the Gauss distribution, the distribution of threshold voltages of a plurality of memory cells M21 connected to the word line WL of the selected row can be detected by differentiating the total of currents Ileft flowing to the second pad 12 or the total of the currents Iright flowing to the third pad 13.

With regard to the differentiation of Ileft or Iright, a more accurate measurement can be achieved when the current value is small than when it is large. Therefore, the current Ileft flowing to the second pad 12 and the current Iright flowing to the third pad 13 are compared with each other to find the smaller one, and the smaller current should be differentiated.

Further, in the characteristics shown in FIG. 7, Ileft is not constant in a strict sense in a region where the word line voltage VWL is low, whereas Iright is not constant in a strict sense in a region where the word line voltage VWL is high. Therefore, in place of differentiating Ileft as mentioned above, Ileft/(Ileft+Iright) should be differentiated, and in place of differentiating Iright as mentioned above, Iright/(Ileft+Iright) should be differentiated, as a normalization process.

Since the threshold distribution of cell transistors M21 for one row in the memory cell array 10 of the non-volatile memory type, can be obtained by measuring the I-V characteristics only once, which is extremely simple as compared to the conventional method in which the reading operation is repeated a great number of times. Such a characteristic is very effective for the problem of an increase in time of evaluation and test, which rises as the memory capacity increases, and therefore the cost for the evaluation can be reduced and the testing time can be shortened.

In the measurement by using the memory cell threshold distribution detection circuit of the first embodiment, it suffices only if the address of the memory cell array 10 is selected in the order in the unit of one row. As compared to the case where the threshold distribution is measured by the conventional reading operation, the threshold distribution can be measured by using an inexpensive DC measurement device without using an expensive measurement device such as an AC tester, thus making it possible to reduce the evaluation cost.

Further, in the case where the threshold distribution is measured by the conventional reading operation, the threshold data of each bit must be recorded in a memory of a large capacity. However, in the measurement using the memory cell threshold distribution detection circuit of the first embodiment, the threshold distribution can be output as a waveform (differentiated waveform), and therefore it is not necessary to provide a memory device of a great capacity, for storing the threshold data, thus making it possible to decrease the evaluation cost, accordingly.

The memory cell threshold distribution detection circuit of the first embodiment can be formed of four NMOS transistors M11, M31, M32 and M33 for one bit line BL, and therefore when other cell array peripheral circuit is made of only NMOS transistors, the circuit can be realized without conducting the step for producing a PMOS transistor.

Of the four transistors M11, M31, M32 and M33, the load transistor M11 has to have a channel length L of some degree, in order to limit the current; however the other transistors M31, M32 and M33 can be formed in a small size, and therefore the area occupied by the detection circuit can be made small as a whole.

In the case where a memory integrated circuit having a large capacity is actually developed, the designing and evaluation of a cell array and those of the peripheral circuits of the cell array are conducted separately from each other in many cases, and the circuit structure for evaluating the cell array should be simplified as much as possible. In this respect, the memory cell threshold distribution detection circuit of the embodiment of the present invention is suitable since it can be made of NMOS transistors only, without having a PMOS producing step.

In many cases, the above-described evaluation of a cell array is carried out before the characteristics of the transistors of the peripheral circuits of the cell array are established. However, even if the threshold of the transistor of the peripheral circuit is varied, the memory cell threshold distribution detection circuit can compensate for such a variation by externally controlling the voltages including the gate voltage VDRV of the load transistor M11, the reference voltage VREF of the voltage comparison circuit CP and the gate voltage V10 of the NMOS transistor M33 for the constant current power, and therefore the detection circuit is suitable for the evaluation carried out in an early stage of the development.

Further, the detection circuit can evaluate a cell array at a low cost in an early stage of the development of a large-capacity memory. Also, when the main body circuit (memory circuit) is constituted by combining the cell array peripheral circuit, after the designing thereof has been completed, with the cell array, the memory cell threshold distribution detection circuit is built therein, thus making it possible to carry out an evaluation which is correlated with the evaluation result obtained in the early stage of the development. Consequently, an effective development can be achieved.

In this case, a PMOS production step is carried out, and therefore a PMOS transistor may be used as the load transistor M11 or a part of the threshold distribution detection circuit may be commonly used with the main body circuit (memory circuit).

FIG. 8 is a diagram showing the second embodiment in which the present invention is applied to the NAND-type EEPROM.

In the memory cell array 80 of the NAND-type EEPROM shown in FIG. 8, NAND strings (a set of three in this embodiment as a typical example) are connected to corresponding bit lines.

Each of the NAND strings is formed of a bit line-side selection gate transistor M41, a plurality of series-connected cell transistors M42, and a source-side selection gate transistor M43, which are connected in series between a bit line BL and a source line (not shown), and the source lines of these NAND strings are connected to a common source line (not shown).

It should be noted that in FIG. 8, reference symbol CP represents a voltage comparison circuit, which may be of the same structure as that shown in FIG. 5. The NMOS transistor M11 is a load transistor, which may be of the same structure as that shown in FIG. 2.

In the memory cell array of the NAND-type EEPROM, the relationship between a word line voltage VWL and a bit line voltage Vbit is basically the same as that explained with reference to FIG. 2B. However, in the selected NAND string, regarding a plurality of cell transistors M42 of non-selected rows, which are connected to the cell transistor M42 of a selected row, the voltage VWL of these word lines of the non-selected rows is set at a high voltage which is sufficiently higher than the power source voltage VCC applied to the first pad 11, so that the cell transistors M42 connected to the word lines of the non-selected rows are rendered conductive.

Usually, a memory cell array of the NAND-type EEPROM is divided into a plurality of blocks. When a sufficiently high voltage is applied to the gate voltage VSELB of the bit line-side selection gate transistor M41 of a selected block and the gate voltage VSELS of the source line-side selection gate transistor 43, as in the word line voltage VWL, so as to suppress the generation of resistive component as much as possible, the characteristics such as shown in FIG. 2B can be obtained.

It should be noted that due to the resistance components of the transistors M41, M42 and M43 connected in series, and the back bias effect along with these components, the cell current ICELL becomes very small as compared to that of the NOR-type EEPROM, and therefore the resistive component of the load transistor M11 (corresponding to the inclination of the characteristic line 1 of FIG. 2B) must be rendered sufficiently large.

The operation of the voltage comparison circuit CP is the same as the case of the NOR-type EEPROM, and therefore the characteristics of VWL versus Ileft and Iright are as shown in FIG. 7. As in the previous embodiment, as the current is differentiated while changing the word line voltage, the distribution of the thresholds of the cell transistors M42 for one row can be easily measured for a short period of time.

In the NAND-type EEPROM, the distribution of the thresholds of the cell transistors M42 is in a range of about −2V to 2V, and therefore the voltage VWL applied to the word line must be changed from a negative value, when the characteristics of VWL versus Ileft, Iright are measured.

More specifically, also in the second embodiment, the word line voltage VWL of non-selected rows in NAND strings of a selected block is set at a high voltage which is sufficiently higher than VCC while turning NAND strings of non-selected blocks in an OFF state, so that the cell transistors M42 of the non-selected rows of the selected block are rendered conductive. While maintaining this state, the cell transistors M42 of the selected rows of the selected block are subjected to the detection method employed in the first embodiment, thereby enabling to obtain a threshold distribution detection operation similar to that of the first embodiment. Consequently, an effect similar to that of the first embodiment can be obtained.

In the present invention, while measuring the distribution of thresholds of the cell transistors of a selected row, the word line voltage VWL is increased gradually from a voltage by which all the cell transistors of the selected row are turned off to a voltage by which all the cell transistors of the selected row are turned on. In the case where the threshold distribution is wide, the cell current may flow excessively into a cell transistor having a low threshold, if the word line voltage is excessively raised.

In the case of a NAND-type cell array, however, a source line-side selection gate transistor M43 is connected to the source sides of the transistors which constitute each NAND string. By controlling the gate voltage VSELS applied to the transistor M43, the maximum current flowing to the cell transistor M42 can be limited, thus removing the above problem. More specifically, the source-side selection gate transistors M43 operate so as not to allow a current of a value higher than a value determined in accordance with the gate voltage VSELS to flow, thus preventing an excessive cell current ICELL from flowing into the cell transistor M42.

As a solution to prevent an excessive cell current ICELL from flowing to the cell transistor M21 of a NOR-type cell array, it is considered that the resistive component of the bit line load M11 is increased. As can be understood from the characteristic line 1 shown in FIG. 2B, the maximum value of the cell current ICELL is determined in accordance with the characteristics of the bit line load M11. When the transistor M11 is used as the bit line load, the maximum value of the cell current ICELL can be suppressed at low by decreasing the gate voltage VDRV of the load transistor M11.

In this embodiment, an EEPROM is employed; however, the present invention can be applied to the EPROM or the mask ROM.

FIG. 9 shows a cell threshold distribution detection circuit according to a third embodiment of the present invention. In this embodiment, the comparison of the bit line voltage and the reference voltage VREF is performed by an operational amplifier OP. The output terminal of the operational amplifier OP is connected to a gate of a detecting NMOS transistor T1. As shown, it is preferable to connect a current-limiting NMOS transistor T2 in series to the detecting NMOS transistor T1 for quantumizing the current flowing through an external terminal 22 to which drains of the detecting NMOS transistors T1 are connected. The above mentioned circuit is provided to each bit line. When the operational amplifier OP detects that the bit line voltage is higher than the reference voltage VREF, the detecting NMOS transistor T1 is turned on so that a current flows through the external terminal 22. The current is differentiated to determine the cell threshold distribution of memory cells of a selected word line WL.

FIG. 10 shows a cell threshold distribution detection circuit according to a fourth embodiment of the present invention. In this embodiment, the detection circuit of this embodiment has not only a cell threshold distribution detection function but also a verify test function. T11, T12 and T13 are transfer gate NMOS transistors. Cross-coupled inverters INV1 and INV 2 constitutes a flip-flop circuit. An NMOS transistor T14 receives at the gate the bit line voltage and forcibly inverts the logic level of data of the flip-flop circuit. An NMOS connecteor T15 is connected in series to the NMOS transistor T14, the gate of which is controlled by an enable signal. The data node N1 of the flip-flop circuit at a side of the memory cell array is connected to the bit line through the transfer gate NMOS transistor T11. The data node N2 of the flip-flop circuit of the opposite side is connected to the gate of the detecting NMOS transistor T16 through the transfer gate NMOS transistor T12. It is preferable to provide a current-limiting NMOS transistor T17 connected in series to the detecting NMOS transistor T16 for quantumizing the current flowing through an external terminal 22 to which drains of the detecting NMOS transistors T16 are connected. External terminal 23 is connected to the gates of the current-limiting NMOS transistors T17, and a bias voltage is applied to the gates to of these transistors T17 via the external terminal 23, thereby functioning the NMOS transistors T17 as current-limiting elements.

In the cell threshold distribution detection, when all the cell transistors M42 connected in a selected word line are turned on, the data node of all of the flip-flop circuits FF of the detection side is logic 1, so that all the detection NMOS transistors are turned on. Thus, by differentiating the current flowing through the external terminal 22, the cell threshold distribution can be determined.

On the other hand, in the verify test mode, when a desired data has been written into all of the cell transistors M42 in a selected word line, the data node of all of the flip-flops FF of the detection side is logic 0, so the at all the detection NMOS transistors are turned off. Thus, no current flows through the external terminal 22 and a verify signal VRY is outputted.

FIG. 11 shows a cell threshold distribution detection circuit according to a fifth embodiment of the present invention. The detection circuit of this embodiment differs from that of the FIG. 10 embodiment in that NMOS transistors T14 and T15 are omitted and NMOS transistors T18 and T19 are added. NMOS transistors T18 and T19 constitute a data rewriting circuit. The basic operation of this circuit is similar to that of the circuit of FIG. 10 embodiment and therefore an explanations omitted.

Figure 12:
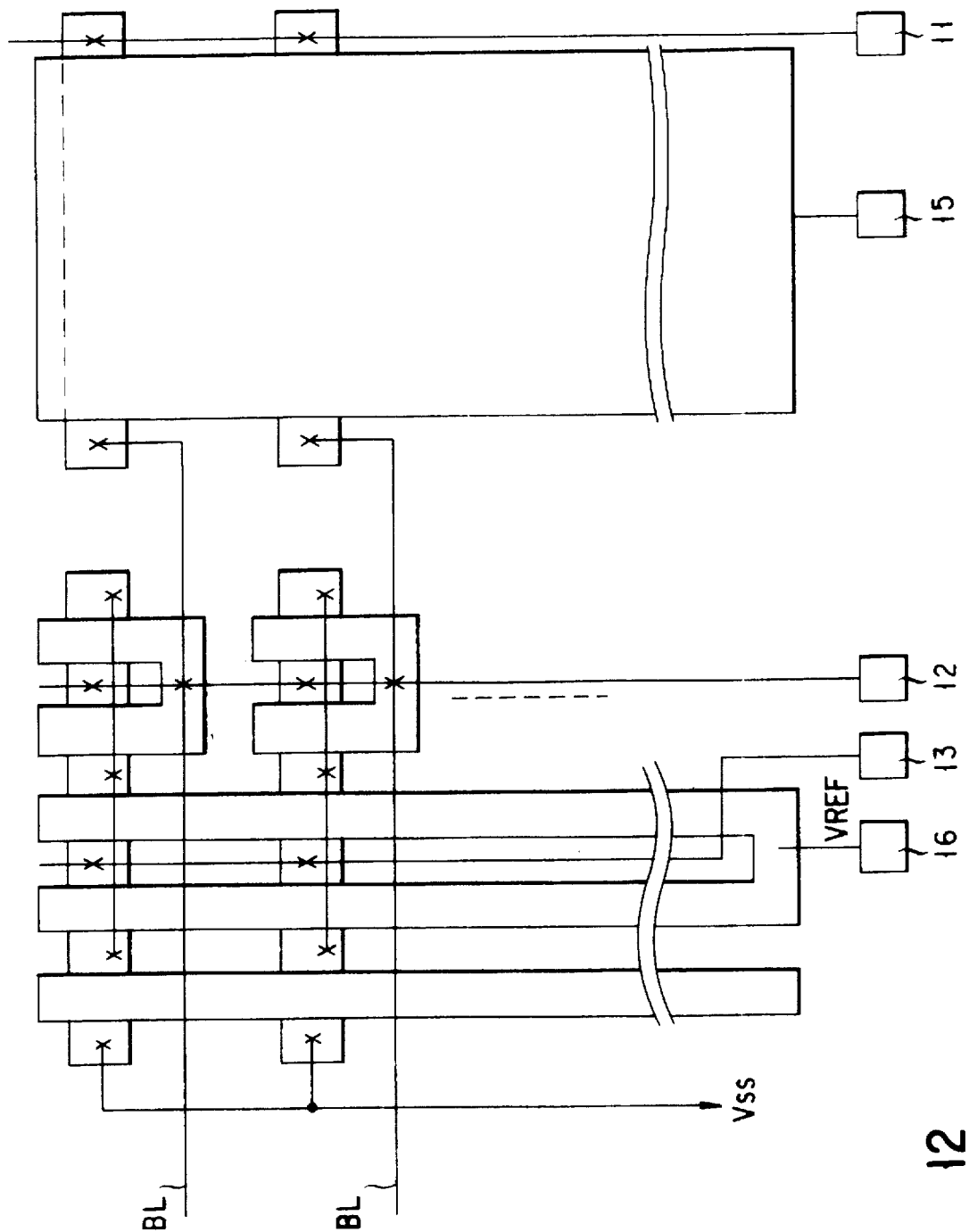
FIG. 12 shows a pattern of the voltage comparison circuit of the cell threshold distribution detection circuit shown in FIG. 1.

FIG. 12 shows a pattern of the voltage comparator circuit of the cell threshold distribution circuit shown in FIG. 1.

As shown in FIG. 12, the comparison circuit comprises a plurality of rows extending in a first direction formed in the semiconductor substrate. Each of the rows includes first to sixth impurity regions of a conductivity type. A first conductive pattern extends in a second direction perpendicular to the first direction. A second conductive pattern extends in the second direction. A plurality of third conductive patterns extend in the second direction. The first conductive pattern includes a conductive layer extending over the rows and between first and second impurity regions. The second conductive pattern includes first and second conductive layers connected at one ends thereof by a conductive layer extending in the first direction, extending over the rows and between the second impurity region and the third impurity region and between the third impurity region and the fourth impurity region, respectively. Each of the third pattern includes fourth and sixth conductive layers connected at one ends thereof by a conductive layer extending in the first direction, extending over a row and between fourth impurity region and the fifth impurity region and between the fifth impurity region and the sixth impurity region, respectively. A first wiring layer connects the second impurity region, the fourth impurity region, and the sixth impurity region in a row. A second wiring layer connects the first impurity regions to a reference potential external terminal. A third wiring layer connects the third impurity regions to a first external terminal. A fourth wiring layer connects fifth impurity regions to a second external terminal. A fifth wiring layer connects the second conductive pattern to a third external terminal supplied with a reference potential.

A plurality of bit lines extend in the first direction, each connected to the third conductive pattern.

A plurality of word lines extend in the second direction, each connected to those of the cell transistors which are in a corresponding row in the memory cell array.

As described above, with the memory cell threshold distribution detection circuit and the memory cell threshold distribution detection method according to the present invention, the distribution of the threshold of cell transistors in one row of a non-volatile memory cell array can be measured by the I-V characteristic measurement for one time, and therefore, the measurement can be conducted very simply as compared to the conventional method in which the reading operation is repeated a great number of times. Such a characteristic is very effective for the problem of an increase in time of evaluation and test, which rises as the memory capacity increases, and therefore the cost for the evaluation can be reduced and the testing time can be shortened.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A circuit for providing a cell threshold distribution output comprising:
    a memory cell array, formed on a semiconductor substrate, in which cell transistors constituting non-volatile memory cells are arranged in rows and columns;
    a plurality of word lines each connected to cell transistors of a corresponding row of said memory cell array and applied with a word line voltage for selecting the row;
    a plurality of bit lines for transferring data from/to cell transistors of said memory cell array;
    a plurality of bit line loads connected between said bit lines of said memory cell array and a first pad; and
    a plurality of voltage comparison circuits each connected to a respective corresponding one of said bit lines, each voltage comparison circuit comparing a voltage of the corresponding bit line with a reference voltage each voltage comparison circuit having a first current node for allowing a first current to flow in the case where the bit line voltage of the corresponding bit line is higher than the reference voltage, and a second current node for allowing a second current to flow in the case where the bit line voltage of the corresponding bit line is lower than the reference voltage, the first current nodes of each of said voltage comparison circuits being connected to a second pad and the second current nodes of each of said voltage comparison circuits being connected to a third pad.

2. A circuit according to claim 1, wherein each of said plurality of voltage comparison circuits includes:
    a first NMOS transistor, a first end of which is connected to said second pad and a gate of which is connected to the corresponding bit line;
    a second NMOS transistor, a first end of which is connected to said third pad, a gate of which is connected to the reference voltage and a second end of which is connected to a second end of said first NMOS transistor; and
    a constant current source connected to a node between said first and second NMOS transistors and a ground node.

3. A circuit according to claim 2, wherein said constant current source comprises an NMOS transistor, a gate of which is connected to a fourth pad and applied with a gate voltage via said fourth pad.

4. A circuit according to claim 2, wherein each of said bit line loads comprises an NMOS transistor.

5. A circuit according to claim 4, wherein a gate of each of said NMOS transistors comprising said bit line loads is connected to a fifth pad and applied with a gate voltage via said fifth pad.

6. A circuit according to claim 2, wherein a fourth pad is provided and applied with the reference voltage.

7. A method of providing a cell threshold distribution output applied to a circuit for providing a cell threshold distribution detection output comprising: a memory cell array, formed on a semiconductor substrate, in which cell transistors constituting non-volatile memory cells are arranged in rows and columns; a plurality of word lines each connected to cell transistors of a corresponding row of said memory cell array; a plurality of bit lines for transferring data from/to cell transistors of said memory cell array; a plurality of bit line loads connected between said bit lines of said memory cell array and a first pad; and a plurality of voltage comparison circuits each connected to a respective corresponding one of said bit lines, each voltage comparison circuit comparing a voltage of the corresponding bit line with a reference voltage and each voltage comparison circuit having a first current node for allowing a first current to flow in the case where the bit line voltage of the corresponding bit line is higher than the reference voltage, and a second current node for allowing a second current to flow in the case where the bit line voltage of the corresponding bit line is lower than the reference voltage, the first current nodes of each of said voltage comparison circuits being connected to a second pad and the second current nodes of each of said voltage comparison circuits being connected to a third pad, said method comprising the steps of:
    applying voltages to the word lines of non-selected rows in said memory cell array so that all the memory cells connected to the word lines of the non-selected rows are turned off;
    increasing a voltage of a word line of a selected row in said memory cell array from a voltage by which all the memory cells connected to the word line of the selected row are turned off to a voltage by which all the memory cells connected to the word line of the selected row are turned on; and
    detecting a cell threshold distribution of the memory cells connected to the word line of the selected row by differentiating at least one of a current flowing in the second pad and a current flowing in the third pad, which change in accordance with a change in the voltage of the word line of the selected row.

8. A circuit for providing a cell threshold distribution output comprising:
    a memory cell array, formed on a semiconductor substrate, in which a plurality of cell transistors constituting a plurality of non-volatile memory cells are arranged in rows and columns;
    a plurality of word lines each connected to those of the cell transistors which are in a corresponding row in said memory cell array;
    a plurality of bit lines for transferring data from/to the cell transistors of said memory cell array;
    a plurality of voltage comparison circuits each connected to a respective corresponding one of said bit lines, each voltage comparison circuit having a first current node and a second current node and each voltage comparison circuit comparing a voltage of the corresponding bit line and a reference voltage to allow a first current to flow through said first current node in the case where the voltage of the corresponding bit line is higher than the reference voltage and a second current to flow through said second current node in the case where the voltage of the corresponding bit line is lower than the reference voltage;

a first pad connected to the first current nodes of each of said voltage comparison circuits;

a second pad connected to the second current nodes of each of said voltage comparison circuits; and a plurality of third pads, each of said third pads connected to a respective corresponding one of said word lines.

9. A circuit according to claim 8, wherein each of said voltage comparison circuits includes:

a first NMOS transistor, a first end of which is connected to said first pad and a gate of which is connected to the corresponding bit line;

a second NMOS transistor, a first end of which is connected to said second pad, a gate of which is connected to the reference voltage and a second end of which is connected to a second end of said first NMOS transistor; and a constant current source connected to a node between said first and second NMOS transistors and a ground node.

10. A circuit according to claim 9, wherein said constant current source includes an NMOS transistor, a gate of which is connected to a fourth pad applied with an external gate voltage.

11. A circuit according to claim 8, further including loads connected between a power supply and said bit lines, each load comprising an NMOS transistor.

12. A circuit according to claim 11, wherein the gates of the NMOS transistors comprising said loads are connected to a fifth pad applied with an external gate voltage.

13. A circuit according to claim 8, further including a fourth pad applied with the reference voltage.

14. A circuit for providing a cell threshold distribution output comprising:

a memory cell array, formed on a semiconductor substrate, in which a plurality of cell transistors constituting a plurality of non-volatile memory cells are arranged in rows and columns;

a plurality of word lines each connected to those of the cell transistors which are in a corresponding row in said memory cell array;

a plurality of bit lines for transferring data from/to the cell transistors of said memory cell array;

a plurality of operational amplifiers, each operational amplifier connected to a respective corresponding one of said bit lines, each operational amplifier comparing a voltage of the corresponding bit line and a reference voltage to output an output voltage having a first level in the case where the voltage of the corresponding bit line is higher than the reference voltage and a second level in the case where the voltage of the corresponding bit line is lower than the reference voltage;

a first pad;

a plurality of NMOS transistors, each NMOS transistor having a gate for receiving an output voltage of a respective corresponding one of said operational amplifiers and a first end connected to said first pad, each of the NMOS transistors being turned on when the output voltage of the corresponding operational amplifier has the first level to thereby allow a current through said first pad to flow; and a plurality of second pads, each of said second pads connected to a respective corresponding one of said word lines.

15. A circuit according to claim 14, further including a plurality of current limiting NMOS transistors, each current limiting NMOS transistor being connected in series to one of said NMOS transistors.

16. A circuit according to claim 14, further including load connected between a power supply and said bit lines, each load comprising an NMOS transistor.

17. A circuit according to claim 16, wherein gates of the NMOS transistors comprising said loads are connected to a third pad applied with an external gate voltage.

18. A circuit according to claim 14, further including a third pad applied with the reference voltage.

19. A circuit for providing a cell threshold distribution output comprising:

a memory cell array, formed on a semiconductor substrate, in which a plurality of cell transistors constituting a plurality of non-volatile memory cells are arranged in rows and columns;

a plurality of word lines each connected to those of the cell transistors which are in a corresponding row in said memory cell array;

a plurality of bit lines for transferring data from/to the cell transistors of said memory cell array;

a plurality of operational amplifiers each connected to a respective corresponding one of said bit lines, each operational amplifier comparing a voltage of the corresponding bit line and a reference voltage to output an output voltage having a first level in the case where the voltage of the corresponding bit line is higher than the reference voltage and a second level in the case where the voltage of the corresponding bit line is lower than the reference voltage;

a first pad;

a plurality of NMOS transistors, each NMOS transistor having a gate for receiving an output voltage of a corresponding one of said operational amplifiers, a first end connected to said first pad, and a second end connected to ground, each of the NMOS transistors being turned on when the output voltage of the corresponding operational amplifier has the first level to allow a current through said first pad to flow; and a plurality of second pads, each of said second pads connected to a respective corresponding one of said word lines.

20. A circuit for providing a cell threshold distribution output comprising:

a memory cell array, formed on a semiconductor substrate, in which cell transistors constituting non-volatile memory cells are arranged in rows and columns, said cell transistors arranged in NAND strings each comprising a plurality of said cell transistors and a selection-gate transistor connected in series;

a plurality of word lines each connected to those of the cell transistors which are in a corresponding row in said memory cell array;

a plurality of bit lines for transferring data from/to the cell transistors of said memory cell array;

a plurality of flip-flop circuits each connected to a respective corresponding one of said bit lines, each flip-flop circuit having a first data node and a second data node for latching complementary logic level data, the first data node being connected to said memory cell array;

a first pad;

a plurality of first NMOS transistors, each first NMOS transistor having a gate connected to the second data node of a corresponding flip-flop circuit, a first end connected to said first pad, and a second end connected to ground, each of said first NMOS transistors being turned on when a logic level data of the second date node of the corresponding flip-flop circuit changes from a first logic level to a second logic level to allow a current through said first pad to flow; and a plurality of second pads, each of said second pads connected to a respective corresponding one of said word lines.

21. A circuit according to claim 20, further including loads connected between a power supply and said bit lines, said loads comprising PMOS transistors.

22. A circuit according to claim 21, wherein gates of the PMOS transistors comprising the loads are connected to a third pad applied with an external a gate voltage.

23. A circuit according to claim 20, further including a plurality of current limiting NMOS transistors, each current limiting NMOS transistor connected in series to one of said first NMOS transistors.

24. A circuit according to claim 20, further comprising a third pad connected to gates of said current limiting NMOS transistors.

25. A circuit according to claim 20, further comprising a data rewriting circuits each including second and third NMOS transistors connected in series between a power supply node and a corresponding bit line, a gate of the second NMOS transistor being connected to a third pad applied with a gate control signal and a gate of the third NMOS transistor being connected to the first data node of a corresponding flip-flop circuit, and a first transfer gate transistor connected between the corresponding bit line and the first data node of the corresponding flip-flop circuit, a second transfer gate transistor being connected between the second data node of the corresponding flip-flop circuit and the gate of a corresponding first NMOS transistor and a third transfer gate transistor connected between the first data node of the corresponding flip-flop circuit and the gate of the corresponding first NMOS transistor.

26. A circuit according to claim 20, further comprising a PMOS transistor for power supply, connected between a power supply and the drains of said first NMOS transistors.

27. A circuit according to claim 20, further comprising inverting circuits for inverting the data logic level of the second data terminal of said flip-flop circuits, each inverting circuit including second and third NMOS transistors connected in series between the second data node of a corresponding flip-flop circuit and the ground potential, a gate of the second NMOS transistor being connected to a corresponding bit line and a gate of the third NMOS transistor being connected to a third pad supplied with a gate control signal, first transfer gate transistors connected between said bit lines and the first data nodes of said flip-flop circuits, second transfer gate transistors connected between the second data nodes of said flip-flop circuits and the gates of said first transistors, and third transfer gate transistors connected between the first data nodes of said flip-flop circuits and the gates of said the first NMOS transistors.

28. A circuit for providing a cell threshold distribution output comprising:

a memory cell array, formed on a semiconductor substrate, in which a plurality of cell transistors constituting a plurality of non-volatile memory cells are arranged in rows and columns;

a plurality of voltage comparison circuits each connected to a respective corresponding one of said bit lines, each voltage comparison circuit comprising a plurality of rows extending in a first direction formed in the semiconductor substrate, each of the rows including first to sixth impurity regions of a conductivity type, a first conductive pattern extending in a second direction perpendicular to said first direction, a second conductive pattern extending in the second direction, and a plurality of third conductive patterns extending in the second direction, the first conductive pattern including a conductive layer extending over the rows and between first and second impurity regions, the second conductive pattern including first and second conductive layers connected at one ends thereof by a conductive layer extending in the first direction, extending over the rows and between the second impurity region and the third impurity region and between the third impurity region and the fourth impurity region, respectively, each of the third patterns including fourth and sixth conductive layers connected at one ends thereof by a conductive layer extending in the first direction, extending over a row and between the fourth impurity region and the fifth impurity region and between the fifth impurity region and the sixth impurity region, respectively, a first wiring layer for connecting the second impurity region, the fourth impurity region, and the sixth impurity region in a row, a second wiring layer for connecting the first impurity regions to a reference potential pad, a third wiring layer for connecting the third impurity regions to a first pad, a fourth wiring layer for connecting fifth impurity regions to a second pad, a fifth wiring layer for connecting the second conductive pattern to a third pad supplied with a reference potential;

a plurality of bit lines extending in the first direction, each connected to the third conductive pattern; and a plurality of word lines extending in the second direction, each connected to those of the cell transistors which are in a corresponding row in said memory cell array.

* * * * *